(12) United States Patent
Takada et al.

(10) Patent No.: US 6,259,290 B1
(45) Date of Patent: Jul. 10, 2001

(54) DELAY LOCKED LOOP HAVING A MIS-LOCK DETECTING CIRCUIT

(75) Inventors: Shuichi Takada, Kawasaki; Akihiko Yoshizawa, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/332,899

(22) Filed: Jun. 15, 1999

(30) Foreign Application Priority Data

Jun. 30, 1998 (JP) ................................................. 10-185127

(51) Int. Cl.[7] ....................................................... H03L 7/06
(52) U.S. Cl. ............................ 327/158; 327/160; 327/269
(58) Field of Search ................................. 327/5, 158, 160, 327/161, 162, 276, 269, 299, 277

(56) References Cited

U.S. PATENT DOCUMENTS

| 5,005,079 | * | 4/1991 | Satomi | ................................... | 358/158 |
| 5,223,755 | | 6/1993 | Richley | ................................. | 307/603 |

FOREIGN PATENT DOCUMENTS 4-364609   12/1992  (JP) .

* cited by examiner

Primary Examiner—Toan Tran
Assistant Examiner—Cassandra Cox
(74) Attorney, Agent, or Firm—Oblon, Spivak, McClelland, Maier & Neustadt, P.C.

(57) ABSTRACT

A delay locked loop has a voltage-controlled delay section and a mis-lock detecting circuit. The voltage-controlled delay sections comprises a plurality of controlled delay circuits, including a specific one. In the mis-lock detecting circuit, there are generated pulse signals, each having a pulse width equivalent to the delay time between the delayed signals output from the adjacent two of the controlled delay circuits preceding the specific controlled delayed circuit. Another pulse signal is generated, which has a pulse width equivalent to the delay time between the delayed signals output from adjacent two of the specific controlled delay circuit and the other controlled delay circuits following the specific one. These pulse signals are added, generating a pulse signal. The number of pulses this pulse signal has per a unit time is compared with the number of pulses a reference signal has per the unit time, thereby detecting whether the delay locked loop is normally locked or not.

15 Claims, 10 Drawing Sheets

DELAY LOCKED LOOP HAVING A MIS-LOCK DETECTING CIRCUIT

BACKGROUND OF THE INVENTION

The present invention relates to a delay locked loop for use in N-multiplication circuits, multi-phase clock generators or the like, which delays an input signal by the time corresponding to a control voltage. The invention also relates to a delay locked loop that has a mis-lock detecting circuit and generating a control signal to release the loop from a mis-locked state. FIG. 1 shows an N-multiplication circuit having a conventional delay locked loop.

The N-multiplication circuit comprises a DLL (Delay Locked Loop) 101 and an N-multiplied signal synthesizing circuit 102. The DLL 101 comprises a voltage-controlled delay section 103, a phase comparator (PHC) 104, a low-pass filter (LPF) 105, and a mis-lock detector 106.

The voltage-controlled delay circuit 103 comprises a plurality of voltage-controlled delay circuits that are connected in series. A reference signal FREF is input to the voltage-controlled delay section 103. The voltage-controlled delay circuits operate sequentially, each delaying the reference signal FREF delayed by the immediately preceding voltage-controlled delay circuit. The delay time of each voltage-controlled delay circuit is controlled by the voltage of a control signal LPFO output from the low-pass filter 105.

The phase comparator 104 has two input terminals. One input terminal receives the reference signal FREF. The other input terminal receives the delayed signal FSIG supplied from the last delay circuit of the voltage-controlled delay section 103. The phase comparator 104 detects the phase difference between the two input signals, at the leading edges of the input signals or the trailing edges thereof. The comparator 104 outputs an error signal VERR representing the phase difference it has detected. The phase comparator 104 also receives an up-signal output from the mis-lock detector 106, as will be described later. In the comparator 104, the error signal VERR is set at high level in accordance with the logic value of the up-signal. The error signal VERR is input to the low-pass filter 105.

The low-pass filter 105 extracts the direct-current component from the error signal VERR and supplies the component, as a control signal, to the voltage-controlled delay section 103.

The delayed signals S1 to S4 output from the voltage-controlled delay circuits of the section 103 are input to the mis-lock detecting circuit 106. More specifically, the delayed signals S1 and S2 output by the two voltage-controlled delay circuits, which are different in phase from the reference signal FREF, are inverted by two inverters, respectively, and input to the AND circuit 107 provided in the mis-lock detecting circuit 106. And the delayed signals S3 and S4 output by the two other voltage-controlled delay circuits, which are more different in phase from the reference signal FREF than the signals S1 and S2, are input to the AND circuit 107 without being inverted. The output of the AND circuit 107 is input to the latch circuit 108 incorporated in the mis-lock detecting circuit 106. The output of the latch circuit 108 is input, as up-signal, to the phase comparator 104. The latch circuit 108 receives the reference signal FREF at its clock input terminal.

The N-multiplied signal synthesizing circuit 102 receives n number of multi-phase clock signals F1 to Fn which have been output from the voltage-controlled delay section 103 and which differ in phase from one another. Using these multi-phase clock signals F1 to Fn, the signal synthesizing circuit 102 generates an N-multiplied signal.

In the DLL 101, the voltage-controlled delay section 103, the phase comparator 104 and low-pass filter 105 constitute a closed loop circuit. The closed loop circuit controls the voltage of the control signal LPFO so that the phase difference between the reference signal FREF and the delayed signal FSIG output by the delay section 103 may be substantially eliminated.

As long as the DLL 101 remains normally locked, the delayed signal FSIG output from the voltage-controlled delay section 103 is delayed by one cycle with respect to the reference signal FREF. The phases of the delayed signal FSIG and reference signal FREF are compared by the phase comparator 104, at the leading edge or the trailing edge only. In the conventional delay locked loop (FIG. 1), it is therefore impossible to detect whether or not the components of the voltage-controlled delay section 103 are operating normally at all.

FIG. 2 illustrates the internal state of the voltage-controlled delay section 103 and the relationship of the four delayed signals S1 to S4.

The voltage-controlled delay section 103 assumes State 1 when all components operate normally. While remaining in State 1, the circuit 103 generates a signal that is delayed by one cycle with respect to the reference signal FREF. As long as the circuit 103 stays in State 1, the delayed signals S1 and S2 remain at low level, and the delayed signals S3 and S4 remain at high level. At the leading edge of the reference signal FREF, the latch circuit 108 latches the output signal of the AND circuit 107. The up-signal is thereby set at high level. In this case, it is determined that the DLL 101 is normally locked, and the output signal of the phase comparator 104 is not forcibly set into up-state, or set at high level. Thus, the DLL 101 keeps operating normally.

The voltage-controlled delay section 103 may delay the reference signal FREF twice as much as it delays the signal FREF while the DLL 101 is normally locked. If so, the circuit 103 assumes State 2 (i.e., 1/2-locked state). In this case, the delayed signal S2 is at low level, though it should be at high level, and the delayed signal S3 is at high level, though it should be at low level. While the voltage-controlled delay section 103 remains in State 2, the output signal of the AND circuit 107 of the mis-lock detecting circuit 106 remains at low level. Hence, the up-signal, i.e., the output signal of the latch circuit 108 latching the output signal of the AND circuit 107, also remains at low level. As a result, it is determined that the DLL 101 is mis-locked. The output signal of the phase comparator 104 is forcibly set at high level. The voltage-controlled delay section 103 is thereby controlled, shortening the delay time of each voltage-controlled delay circuit incorporated in the circuit 103.

The voltage-controlled delay section 103 may delay the reference signal FREF by a delay time, which corresponds to three cycles of the reference signal FREF. If so, the circuit 103 assumes State 3 (i.e., 1/3-locked state). In this case, the delayed signals S1 and S2 are at low level and the delayed signals S3 and S4 are at high level, as in the case where the circuit 103 assumes State 1. Hence, the mis-lock detecting circuit 106 determines as if the DLL 101 were normally locked.

To prevent such erroneous determination, the voltage-controlled delay section 103 may have more voltage-controlled delay circuits so that the mis-lock detecting circuit 106 may detect more delayed signals and the phases thereof. Even if this measure is taken, erroneous determination will occur when the reference signal FREF is delayed much more.

The voltage-controlled delay section 103 assumes State 4 when the mis-lock detecting circuit 106 determines can correctly determine that the DLL 101 is erroneously locked.

Thus, it is impossible to detect that the DLL is erroneously locked, when the voltage-controlled delay section 103 assumes a particular internal sate.

In the conventional DLL 101, the delayed signals S1 to S4 input to the AND circuit 107 are predetermined. The reference signal FREF input to the voltage-controlled delay section 103 therefore needs to have a fixed duty. In other words, all signals having different duties cannot be used as reference signal FREF in the conventional DLL 101.

The conventional DLL 101 is disadvantageous in another respect. The phase relation between the reference signal FREF and the delayed signal FSIG, both input to the phase comparator 104, may be reversed when the reference signal FREF or the control signal LPFO contains noise. Once the phase relation has been reversed, it is no longer possible to prevent the conventional DLL 101 from being erroneously locked.

How the DLL 101 is erroneously locked due to the noise contained in either the signal FREF or the signal LPFO will be explained below.

FIG. 3A shows the waveforms that the signals FREF, FSIG and VERR have when the voltage of the control signal LPFO temporarily changes due to, for example, a change in the power-supply voltage. In this case, one of the pluses of the delayed signal FSIG is eliminated due to the voltage change in the control signal LPFO as is indicated by broken lines. This reverses the phase relation between the reference signal FREF and the delayed signal FSIG. Consequently, the voltage of the control signal LPFO changes to and fixed at the power-supply voltage Vdd. Inevitably the DLL 101 is erroneously locked.

FIG. 3B depicts the waveforms that the signals FSIG, VERR and LPFO have when the voltage of the reference signal FREF temporarily changes due to, for example, the pulse noise contained in the reference signal FREF. In this case, the phase comparator 104 detects the pulse noise as reference signal FREF. As a consequence, the phase relation between the reference signal FREF and the delayed signal FSIG is reversed. In this case, too, the voltage of the control signal LPFO changes to and fixed at the power-supply voltage vdd. Inevitably the DLL 101 is locked erroneously.

FIG. 3C shows the waveforms that the signals FREF, FSIG and VERR have when the voltage of the control signal LPFO temporarily changes. In this case, the phase comparator 104 performs feedback control to eliminate the phase difference between the delayed signal FSIG and the reference signal FREF if the signal FSIG is delayed by two or more cycles with respect to the reference signal FREF. Due to the feedback control, the DLL 101 is erroneously locked.

In the three cases illustrated in FIGS. 3A, 3B and 3C, the DLL cannot resume normal operation, though it is equipped with the mis-lock detecting circuit 106.

BRIEF SUMMARY OF THE INVENTION

Accordingly, the object of the present invention is to provide a delay locked loop which can use signals of whatever duty as the reference signal and can therefore be put to various uses, the mis-locked state of which can be detected reliably, and which can be released from the mis-locked state to operate normally.

According to the invention, there is provided a delay locked loop comprising: a voltage-controlled delay section for receiving a reference signal and a delay control signal, comprising a plurality of controlled delay circuits connected in series for sequentially delaying the reference signal, thereby to output delayed signals, each of the controlled delay circuits having a delay time controlled by the delay control signal; a phase comparator for receiving a first delayed signal output from a first of the controlled delay circuits and a second delayed signal output from a second of the controlled delay circuits, which is provided on an output side of the first controlled delay circuit, for detecting a phase difference between the first and second delayed signals, and for outputting an error signal representing the phase difference detected; a filter circuit for receiving the error signal from the phase comparator, extracting a direct-current component from the error signal, and supplying the direct-current component, as the delay control signal, to the controlled delay circuits; and a mis-lock detecting circuit for generating pulse signals and at least one pulse signal, adding the pulse signals, thereby generating a sum signal, comparing the sum signal with the reference signal in terms of number of pulses per a unit of time, and detecting a mis-locked state of the voltage-controlled delay section, the pulse signals having a pulse width each, which is equivalent to a delay time between the delayed signals output from adjacent two of the first controlled delay circuit and the controlled delay circuits connected between the first and second controlled delay circuits, and the at least one signal having a pulse width which is equivalent to a delay time between the delayed signals output from adjacent two of the second controlled delay circuit and the controlled delay circuits provided at the output side of the second controlled delay circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described, with reference to the accompanying drawings.

Figure 1:
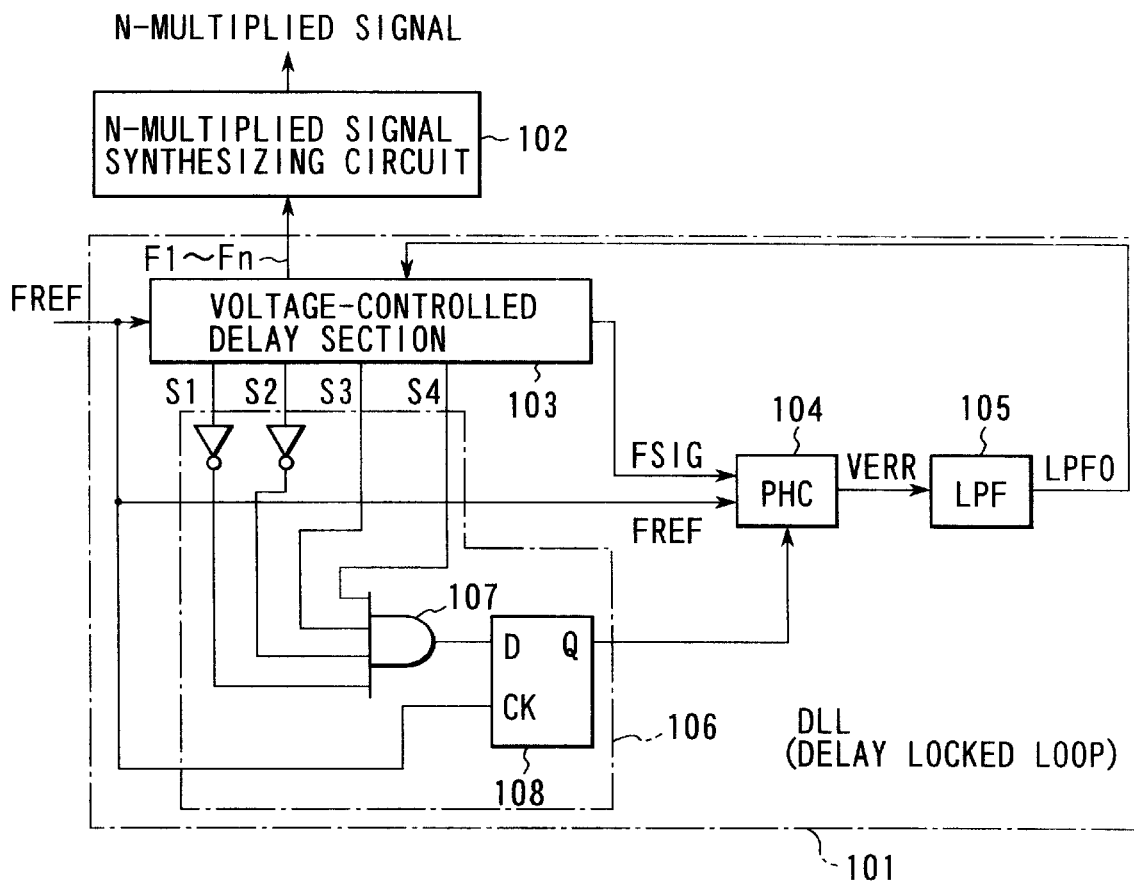
FIG. 1 is a diagram showing an N-multiplication circuit having a conventional delay locked loop.
Figure 2:
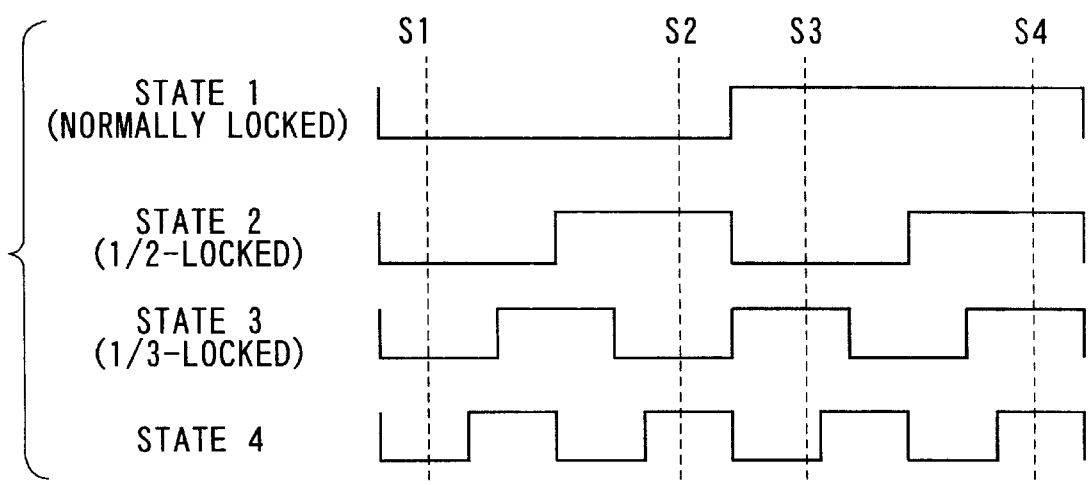
FIG. 2 is a timing chart representing the internal state of the voltage-controlled delay section incorporated in the N-multiplication circuit and the relationship of the delayed signals output from the voltage-controlled delay section.
Figure 3A:
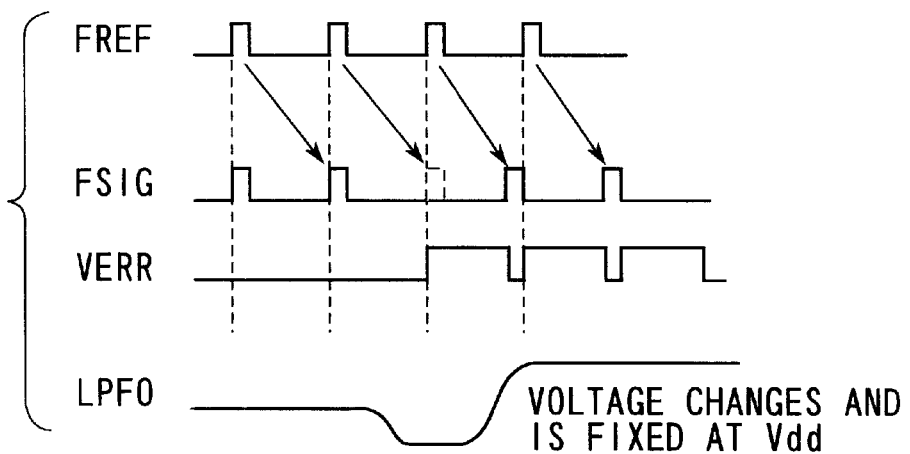
FIGS. 3A, 3B and 3C are waveform diagrams explaining how the delayed lock loop is erroneously locked in various cases.
Figure 3B:
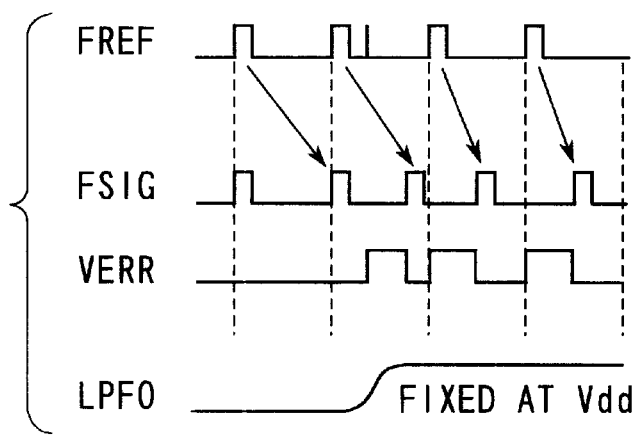
Figure 3C:
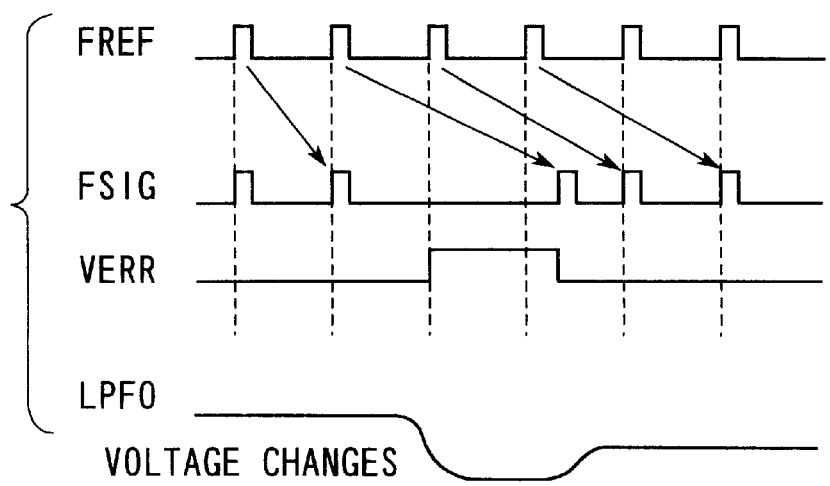
Figure 4:
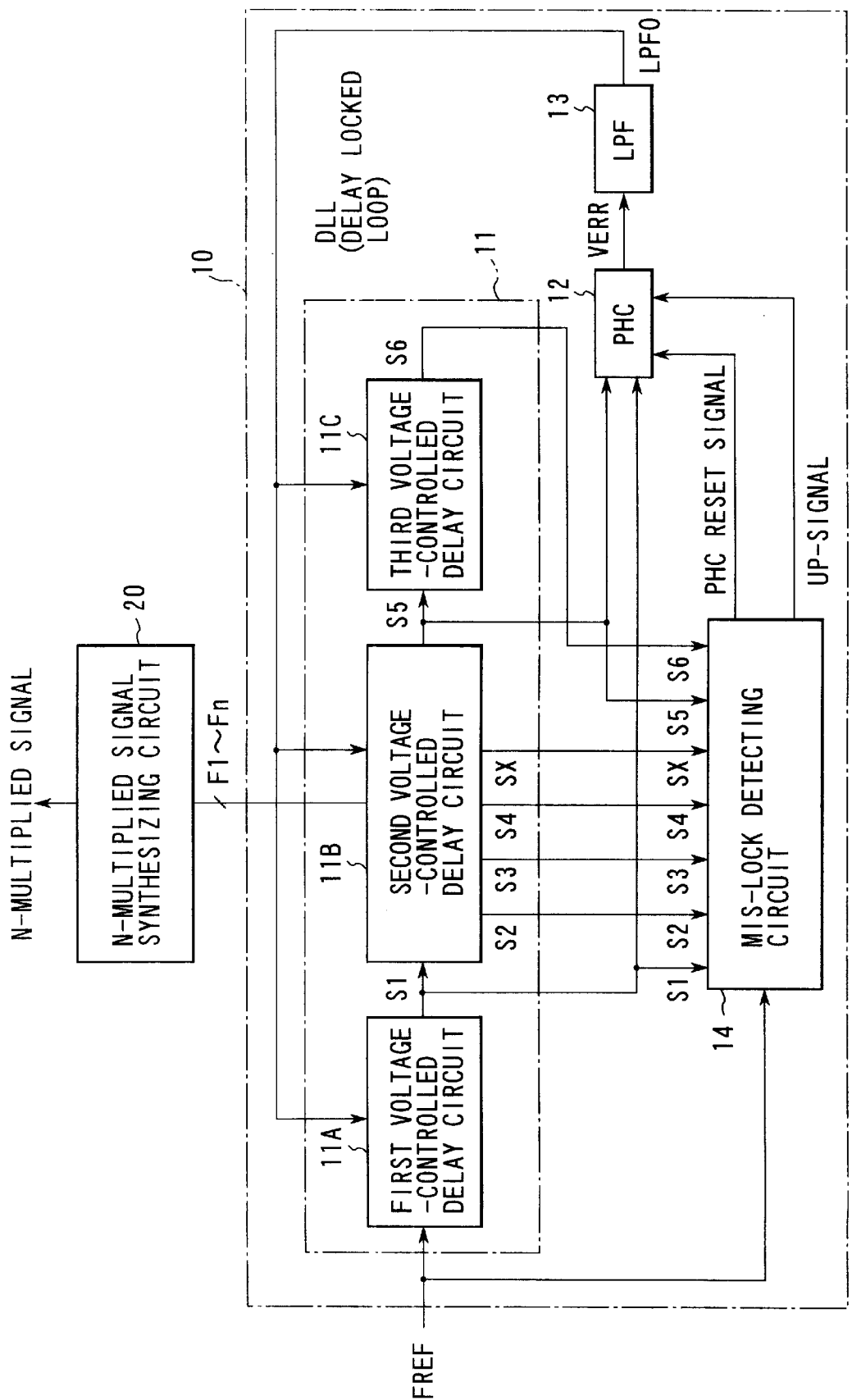
FIG. 4 is a block diagram showing an N-multiplication circuit having a delayed locked loop which is the first embodiment of the invention.

FIG. 4 is a block diagram showing an N-multiplication circuit having a delayed locked loop according to the first embodiment of the invention.

The N-multiplication circuit comprises a DLL 10 and an N-multiplied signal synthesizing circuit 20. The DLL 10 comprises a voltage-controlled delay section 11, a phase comparator (PHC) 12, a low-pass filter (LPF) 13, and a mis-lock detecting circuit 14. The voltage-controlled delay section 11, phase comparator 12 and low-pass filter 13 constitute a closed loop circuit.

The voltage-controlled delay section 11 comprises three voltage-controlled delay circuits 11A, 11B and 11C. The first voltage-controlled delay circuit 11A and the third voltage-controlled delay circuit 11C have at least one controlled delay circuit each. The second voltage-controlled delay circuit 11B has a plurality of controlled delay circuits.

A reference signal FREF is input to the first voltage-controlled delay circuit 11A, which outputs a delayed signal S1. The delayed signal S1 is input to the second voltage-controlled delay circuit 11B, which outputs delayed signals S2 to S5 and SX. The delayed signal SX may be identical to one of the delayed signals S2 to S5 or may be different from the delayed signals S2 to S5. The delayed signal S5, which has been generated by the last controlled delay circuit of the second voltage-controlled delay circuit 11B, is input to the third voltage-controlled delay circuit 11C. The third voltage-controlled delay circuit 11C outputs a delayed signal S6. The delay time of any controlled delay circuit incorporated in the voltage-controlled delay circuits 11A, 11B and 11C is controlled by the voltage of a control signal LPFO output from the low-pass filter 13.

It should be noted that the first voltage-controlled delay circuit 11A is provided for shaping the waveform of the reference signal FREF.

As long as the DLL is normally locked, the voltage-controlled delay section 11, the phase comparator 12 and low-pass filter 13 constitute a closed loop circuit. Therefore, the delayed signal S1 output from the first voltage-controlled delay circuit 11A and the delayed signal S5 output from the last controlled delay circuit of the second voltage-controlled delay circuit 11B are delayed with respect to the reference signal FREF by one cycle of the reference signal FREF.

The phase comparator 12 has two input terminals. At the first input terminal the comparator 12 receives the delayed signal S1 supplied from the first voltage-controlled delay circuit 11A. At the second input terminal it receives the delayed signal S5 supplied from the last controlled delay circuit of the second voltage-controlled delay circuit 11B.

The phase comparator 12 detects the phase difference between the leading edges or trailing edges of the delayed signals S1 and S5 and generates an error signal VERR representing the phase difference. The phase comparator 12 receives a PHC reset signal and an up-signal, both supplied from the mis-lock detecting circuit 14. The PHC reset signal resets the phase comparator 12, depending on its logic value. The up-signal sets the error signal VERR at high level, depending on its logic value. The error signal VERR output from the phase comparator 12 is input to the low-pass filter 13.

The low-pass filter 13 extracts the direct-current component from the error signal VERR. The component is supplied, as control signal LPFO, to the voltage-controlled delay circuits 11A, 11B and 11C that are provided in the voltage-controlled delay section 11.

The delayed signals S1 to S5 output from the first and second voltage-controlled delay circuits 11A, 11B and the delayed signal S6 output from the third voltage-controlled delay circuit 11C are input to the mis-lock detecting circuit 14, together with the reference signal FREF.

From the delayed signals S1 to S6 the mis-lock detecting circuit 14 determines whether the DLL is normally locked or not. If the delay time of each controlled delay circuit is too long, the up-signal is set at the active level (e.g., high level). If the delay time of each controlled delay circuit is too short, the PHC reset signal is set at the active level (e.g., high level).

The N-multiplied signal synthesizing circuit 20 synthesizes an N-multiplied signal, by using n number of multi-phase clock signals F1 to Fn which have been output from the voltage-controlled delay section 11 and which differ in phase from one another.

Figure 5:
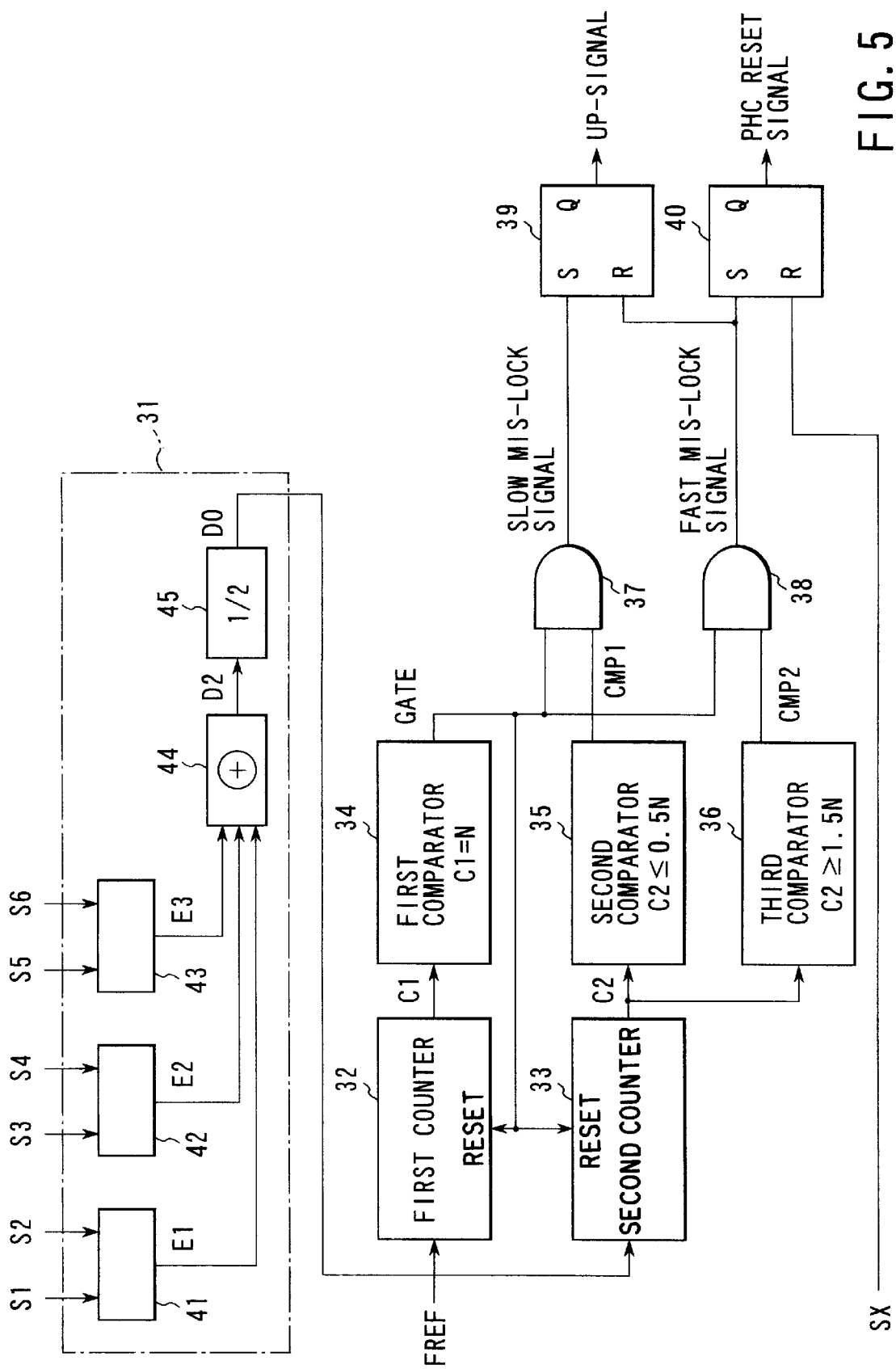
FIG. 5 is a block diagram depicting the mis-lock detecting circuit incorporated in the delayed locked loop shown in FIG. 4.

FIG. 5 is a block diagram depicting the mis-lock detecting circuit 14 in detail. The circuit 14 comprises a mis-lock detect signal generating circuit and a mis-lock control signal generating circuit. The mis-lock detect signal generating circuit comprises a multiplied signal generator 31, two counters 32 and 33, three comparators 34 to 36, two AND circuits 35 and 38. The mis-lock control signal generating circuit comprises two edge-detecting RS flip-flop circuits 39 and 40 (hereinafter referred to as "flip-flop circuits").

The multiplied signal generator 31 comprises three leading-edge detectors 41 to 43, an adder circuit 44, and a ½ frequency divider 45. The first leading-edge detector 41 receives the delayed signals S1 and S2 and outputs a pulse signal E1 that has a pulse width corresponding to the delay time between the leading edges of the delayed signals S1 and S2. The second leading-edge detector 42 receives the delayed signals S3 and S4 and outputs a pulse signal E2 that has a pulse width corresponding to the delay time between the leading edges of the delayed signals S3 and S4. The third leading-edge detector 43 receives the delayed signals S5 and S6 and outputs a pulse signal E3 that has a pulse width corresponding to the delay time between the leading edges of the delayed signals S5 and S6.

The pulse signals E1 to E3 output from the leading-edge detectors 41 to 43, respectively, are input to the adder circuit 44 (an OR circuit). The adder circuit 44 adds the pulse signals E1 to E3, generating a signal D2. The signal D2 is input to the ½ divider 45. The frequency divider 45 divides the frequency of the signal D2, generating a frequency-divided signal D0.

The first counter 32 receives the reference signal FREF, and the second counter 33 receives the frequency-divided signal D0 output from the ½ divider 45. The count signal C1 output from the first counter 32 is input to the first comparator 34, while the count signal output from the second counter 33 is input to the second comparator 35 and third comparator 36.

The first comparator 34 compares the value of the count signal C1 with the first fixed value N. The first comparator 34 outputs a signal GATE, which is set at the active level (e.g., high level) if the value of the count signal C1 is equal to the first fixed value N. The signal GATE is input, as reset signal, to both counters 32 and 33 and both AND circuits 37 and 38. The second comparator 35 compares the value of the count signal C2 with a fixed value (0.5N) that is half the fixed value N. The second comparator 35 outputs a signal CMP1, which is activated if the value of the count signal C2 is equal to or less than 0.5N, that is, if C2≦0.5N. The signal CMP1 is input to the first AND circuit 37. The third comparator 36 compares the value of the count signal C2 with a fixed value (1.5N) that is 1.5 times the fixed value N. The third comparator 36 outputs a signal CMP2, which is activated if the value of the count signal C2 is equal to or greater than 1.5N, that is, if C2≧1.5N. The signal CMP2 is input to the second AND circuit 38.

From the signals GATE and CMP1 the first AND circuit 37 generates a slow mis-lock signal. The slow mis-lock signal is supplied to the set input terminal of the flip-flop circuit 39. Meanwhile, the AND circuit 38 generates a fast mis-lock signal from the signals GATE and CMP2. The fast mis-lock signal is supplied to the reset input terminal of the flip-flop circuit 39 and also to the set input terminal of the flip-flop circuit 40. The delayed signal SX output from the second voltage-controlled delay circuit 11B is supplied to the reset input terminal of the flip-flop circuit 40. The flip-flop circuit 39 generates an up-signal from the slow mis-lock signal and the fast mis-lock signal. The flip-flop circuit 40 generates a PHC reset signal from the delayed signal SX.

The operation of the mis-lock detecting circuit 14 will be explained.

Figure 6:
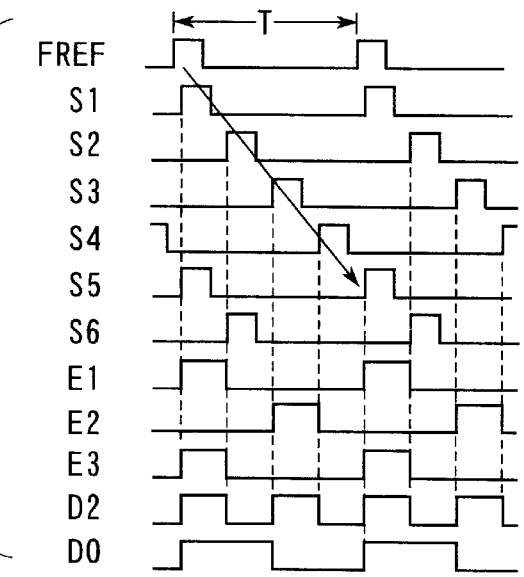
FIG. 6 is a waveform diagram explaining the operation of the mis-lock detecting circuit shown in FIG. 5.
Figure 7:
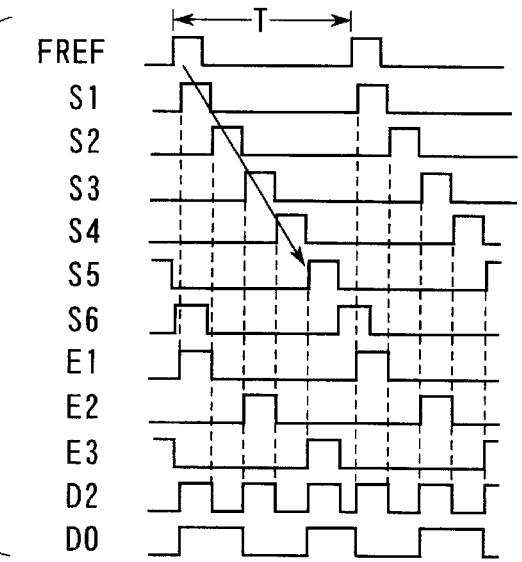
FIG. 7 is another waveform diagram explaining the operation of the mis-lock detecting circuit shown in FIG. 5.
Figure 8:
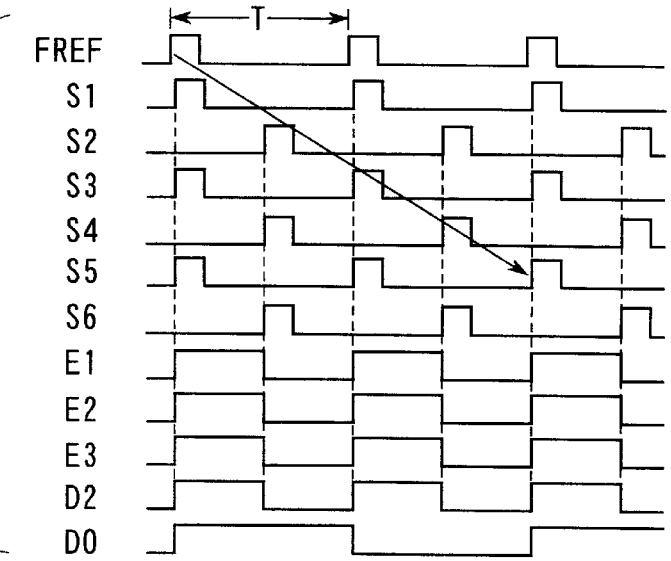
FIG. 8 is still another waveform diagram explaining the operation of the mis-lock detecting circuit shown in FIG. 5.

First, it will be described how the multiplied signal generator 31 operates after it receives the delayed signals S1 to S6 to output frequency-divided signal D0, with reference to FIGS. 6, 7 and 8.

First, with reference to FIG. 6 it will be described how the mis-lock detecting circuit 14 operates when the DLL 10 is normally locked. In this case, the delay time between the leading edges of the delayed signals S1 and S5 is equal to the one-cycle period T of the reference signal FREF. Hence, the pulse signal E3, output from the leading-edge detector 43 and having a pulse width equivalent to the delay time between the leading edges of the delayed signals S5 and S6, is in phase with the pulse signal E1 output from the leading-edge detectors 41 and having a pulse width equivalent to the delay time between the leading edges of the delayed signals S1 and S2. The signal D2 the adder circuit 44 generates by adding the pulse signals E1 to E3, therefore, has two pluses during the one-cycle period of the delayed signal S1. It follows that the output signal D0 of the frequency divider 45, which has divided the signal D2 by 2 has one pulse during the one-cycle period of the delayed signal S1.

Thus, the output signal D0 of the frequency divider 45 has as many pulses as the reference signal FREF during the one-cycle period T as long as the DLL 10 is normally locked.

While the DLL 10 remains locked, the controlled delay circuits of the voltage-controlled delay section 11 may have a shorter delay time than while the DLL 10 remains normally locked. In this case, the leading edge of the delayed signal S6 precedes the leading edge of the delayed signal S1 in the next cycle, as is illustrated in FIG. 7. Therefore, the pulse signal E3 output from the leading-edge detector 43 differs in phase from the pulse signal E1 output from the leading-edge detector 41. As a result, the signal D2 the adder circuit 44 generates by adding the pulse signals E1 to E3 has three pluses during the one-cycle period of the delayed signal S1. Hence, the output signal D0 of the frequency divider 45, which has divided the signal D2 by 2 has substantially 1.5 pulses during the one-cycle period of the delayed signal S1.

That is, the output signal D0 of the frequency divider 45 has 1.5 times or more as many pulses as the reference signal FREF has during the one-cycle period T when the controlled delay circuits of the delay section 11 have a shorter delay time than while the DLL 10 remains normally locked.

While the DLL 10 remains locked, the controlled delay circuits of the voltage-controlled delay section 11 may have a longer delay time than while the DLL 10 remains normally locked. In this case, the pulse signals E1 to E3 output from the leading-edge detectors 41, 42 and 43 are all in phase, as is illustrated in FIG. 8. As a result, the signal D2 the adder circuit 44 generates by adding the pulse signals E1 to E3 has one pulse during the one-cycle period of the delayed signal S1. Thus, the output signal D0 of the frequency divider 45, which has divided the signal D2 by 2 has substantially 0.5 pulses during the one-cycle period of the delayed signal S1.

That is, the output signal D0 of the frequency divider 45 has 0.5 times or less as many pulses as the reference signal FREF has during the one-cycle period T when the controlled delay circuits of the delay section 11 have a longer delay time than while the DLL 10 remains normally locked.

In the mis-lock detecting circuit 14 shown in FIG. 5, the counters 32 and 33 are used to increase the fractional part of the number of pulses that the frequency-divided signal D0 has.

Figure 9:
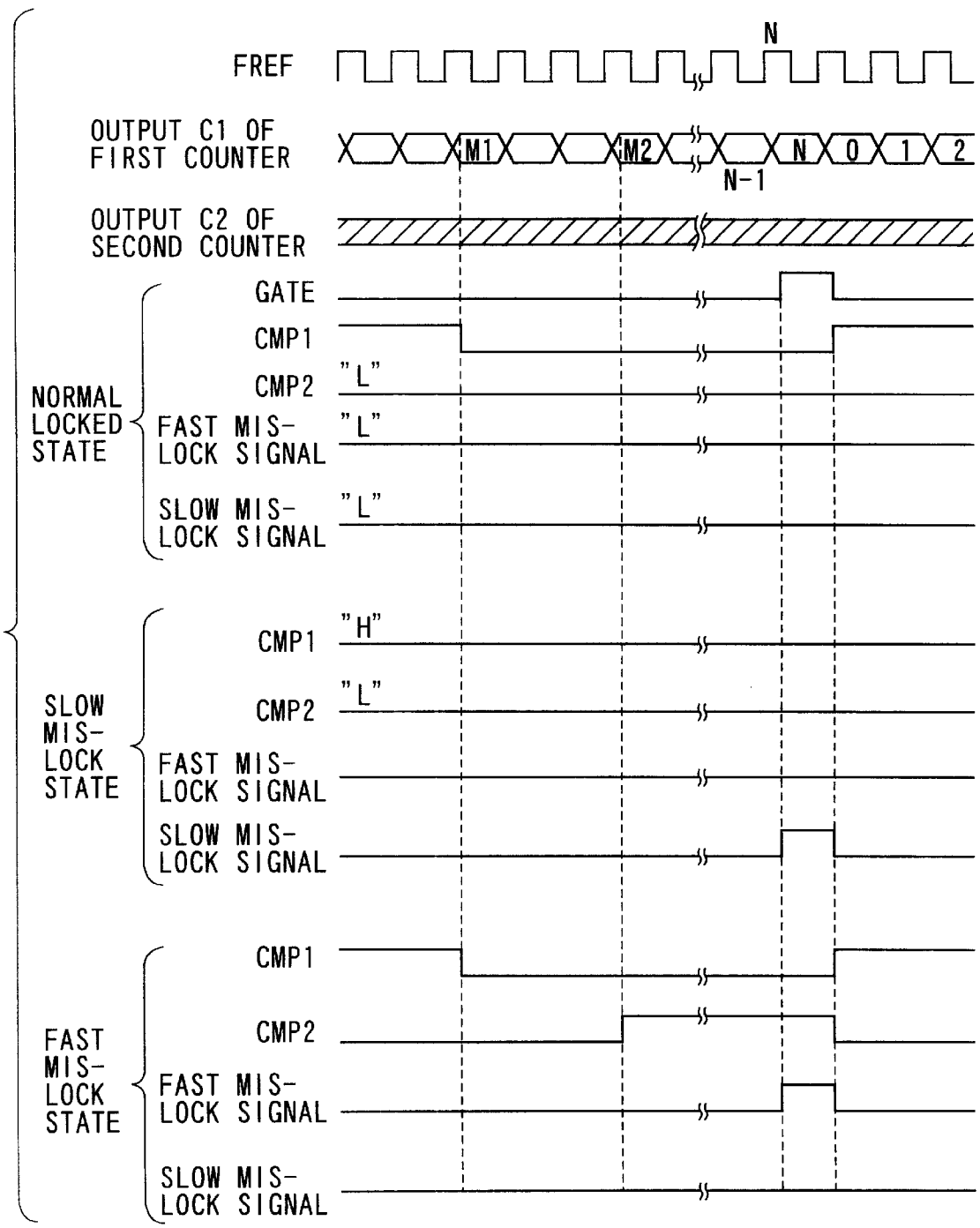
FIG. 9 is also a waveform diagram explaining the operation of the mis-lock detecting circuit shown in FIG. 5.

The operation of the components of the mis-lock detecting circuit 14, other than the multiplied signal generator 31, will now be described with reference to FIG. 9.

As long as the DLL 10 remains normally locked, the second counter 33 counts the pulses of the frequency-divided signal D0, and the first counter 32 counts the pulses of the reference signal FREF. When the count signal C1 output from the first counter 32 reaches the value N (N is 1 or a greater positive integer), the output signal GATE of the first comparator 34 rises to high level. At this time, the DLL 10 still remains normally locked and the count signal C2 output from the second counter 33 reaches the value N, too. The signals CMP1 and CMP2 output from the second and third comparators 35 and 36, respectively, are therefore at low level. It follows that the slow mis-lock signal and the fast mis-lock signal, which have been output from the AND circuits 37 and 38, respectively, are at low level. Hence, neither the flip-flop circuit 39 nor the flip-flop circuit 40 is set.

Namely, while the DLL 10 remains normally locked, both the up-signal output from the flip-flop circuit 39 and the PHC reset signal output from the flip-flop circuit 40 are at low level. The internal state of the phase comparator 12 (FIG. 4) is not reset at all. Nor is the error signal VERR forcibly set at high level. In short, the DLL 10 shown in FIG. 4 stays in the same state as before.

When the count signal C1 output from the first counter 32 reaches the value N, the count signal C2 output from the second counter 33 may have a value greater than 0.5N and less than 1.5N. If so, the DLL 10 is in pull-in state. In this case, too, the count signal C2 output from the second counter 33 has a value greater than 0.5N and less than 1.5N. Both the up-signal and the PHC reset signal are set at low level as in the case mentioned above.

The DLL 10 may be erroneously locked such that the controlled delay circuits of the voltage-controlled delay section 11 have a longer delay time than while the DLL 10 remains normally locked. If this is the case, the count signal C2 of the second counter 33 has a value of 0.5N or less when the count signal C1 of the first counter 32 reaches the value N. As a result, the signal CMP1 output from the second comparator 35 rises to high level. The slow mis-lock signal output from the AND circuit 37 therefore rises to high level. Thereafter, the flip-flop circuit 39 is set, whereby the up-signal is set at high level. When the up-signal is set at high level, the error signal VERR output from the phase comparator 12 (FIG. 4) is forcibly set at high level. The controlled delay circuits incorporated in the voltage-controlled delay section 11 are thereby controlled to have a shorter delay time each. The delay time of each controlled delay circuit remains short until the AND circuit 38 outputs the fast mis-lock signal. When the AND circuit 38 outputs the fast mis-lock signal, the flip-flop circuit 39 is reset, setting the up-signal at low level.

The DLL 10 may be erroneously locked such that the controlled delay circuits of the voltage-controlled delay section 11 have a shorter delay time than while the DLL 10 remains normally locked. In this case, the count signal C2 of the second counter 33 has a value of 1.5N or more when the count signal C1 of the first counter 32 reaches the value N. As a result, the signal CMP2 output from the third comparator 36 rises to high level. The fast mis-lock signal output from the AND circuit 38 therefore rises to high level. Thereafter, the flip-flop circuit 40 is set, whereby the PHC reset signal is set at high level. When the PHC reset signal is set at high level, the phase comparator 12 (FIG. 4) is reset. At the leading edge of the signal SX much delayed with respect to the delayed signal S1, the flip-flop circuit 40 is reset. As a result, the PHC reset signal falls to low level.

The edge-detecting RS flip-flop circuits 39 and 40 are used to detect a fast mis-lock signal. This is because the delayed signal SX has been output from the mid-stage delay circuit incorporated in the voltage-controlled delay section 11, the state of the signal SX assumes after the DLL 10 has been erroneously locked cannot be determined at all.

The first counter 32 and the second counter 33 are reset at the leading edge of the signal GATE output from the first comparator 34. The counters 32 and 33 again start counting the pulses of their respective input signals, in order to determine whether the DLL 10 is normally locked or erroneously locked.

In the DLL 10 shown in FIG. 4, which is the first embodiment of the invention, pulse signals are generated from the delayed signals output from the voltage-controlled delay section 11 and are added, thus generating a signal D2.

The signal D2 and the reference signal FREF are compared in terms of the number of pulses per a unit of time. From the difference in number of pulses between the signals D0 and FREF it is determined whether the DLL 10 is erroneously locked or not. Hence, the reference signal FREF can have any duty. Namely, the DLL 10 can therefore be put to various uses.

Moreover, delayed signals can be used to detect the mis-locked state of the DLL 10, no matter how many and where obtained from. Therefore, the mis-lock state of the DLL 10 can be reliably detected, and the DLL 10 can be released from the mis-locked state to operate normally.

The second embodiment of the present invention will be described below.

Figure 10:
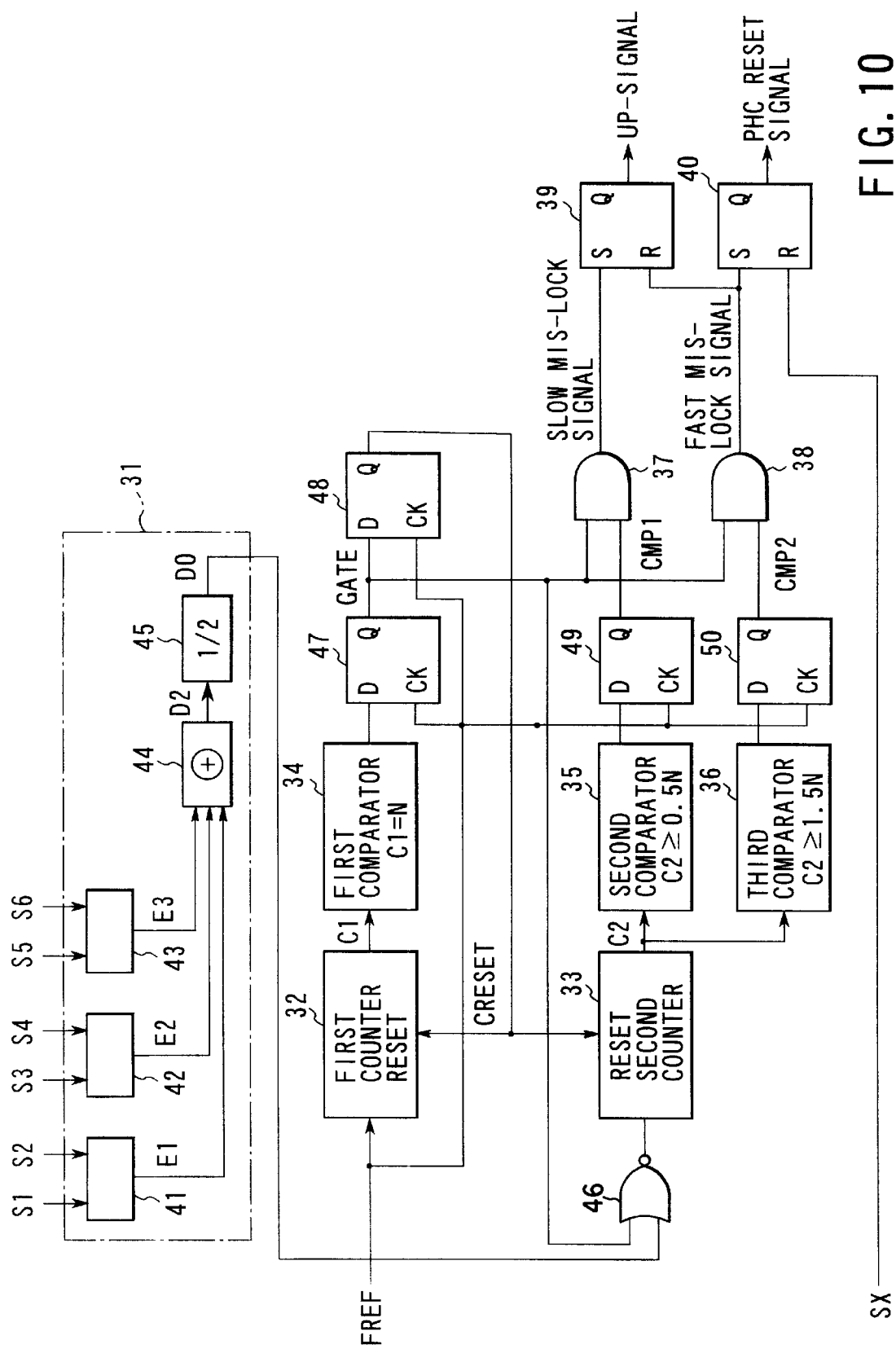
FIG. 10 is a block diagram of the mis-lock detecting circuit incorporated in a delayed locked loop according to the second embodiment of the invention.

FIG. 10 is a block diagram of the mis-lock detecting circuit 14 that is provided in a delayed locked loop which is the second embodiment of the invention. The mis-lock detecting circuit 14 differs from the one shown in FIG. 5 and incorporated in the N-multiplication circuit of FIG. 4, only in that it has, as additional components, a NOR circuit 46 and four latch circuits 47 to 50. Each latch circuit is composed of a D-type flip-flop circuit. The other components of the circuit 14 will not described, because they are identical to those incorporated in the mis-lock detecting circuit of FIG. 5.

The NOR circuit 46 is provided on the line for supplying the signal D0 output by the multiplied signal generator 31. The signal D0 is supplied via the NOR circuit 46 to the second counter 33. The NOR circuit 46 receives the signal output from the latch circuit 47.

The latch circuit 47 receives the output signal of the first comparator 34. The latch circuit 47 also receives, as a sync signal, a reference signal FREF. At the leading edge of the reference signal FREF, the latch circuit 47 latches the output signal of the first comparator 34. The latch circuit 47 outputs a signal GATE. The signal GATE is supplied to the AND circuits 37 and 38 and also to the NOR circuit 46.

The signal GATE is supplied also to the latch circuit 48. The latch circuit 48 receives the reference signal FREF as a sync signal. At the leading edge of the reference signal FREF, the latch circuit 48 latches the signal GATE. The output signal of the latch circuit 48 is supplied, as a reset signal CRESET, to the first counter 32 and the second counter 33.

The output signal of the second comparator 35 is supplied to the latch circuit 49. The latch circuit 49 receives the reference signal FREF as a sync signal. At the leading edge of the reference signal FREF, the latch circuit 49 latches the output signal of the second comparator 35. The latch circuit 49 outputs a signal CMP1.

The output signal of the third comparator 36 is supplied the latch circuit 50. The latch circuit 50 receives the reference signal FREF as a sync signal. At the leading edge of the reference signal FREF, the latch circuit 50 latches the output signal of the third comparator 36. The latch circuit 50 outputs a signal CMP2.

Thus, the latch circuits 47, 49 and 50 latch the output signals of the first to third comparators 34, 35 and 36, respectively, at the leading edge of the reference signal FREF. When the output signal C1 of the first counter 32 reaches the value N, the output signal GATE of the latch circuit 47 rises to high level. The output signal of the NOR circuit 46 is thereby fixed at low level. Thereafter, the signal D0 output from the frequency divider 45 cannot be supplied to the second counter 33.

The count signal C2 output from the second counter 33 is thereby compared with the value 0.5N in the second comparator 35 and with the value 1.5N in the third comparator 36 when the count signal C1 output from the first counter 32 becomes equal to the value N. Further, the AND circuits 37 and 38 determine a normally locked state, a long mis-locked state or a short mis-locked state of the DLL 10 from the levels of the signals latched in the latch circuits 49 and 50.

Figure 11:
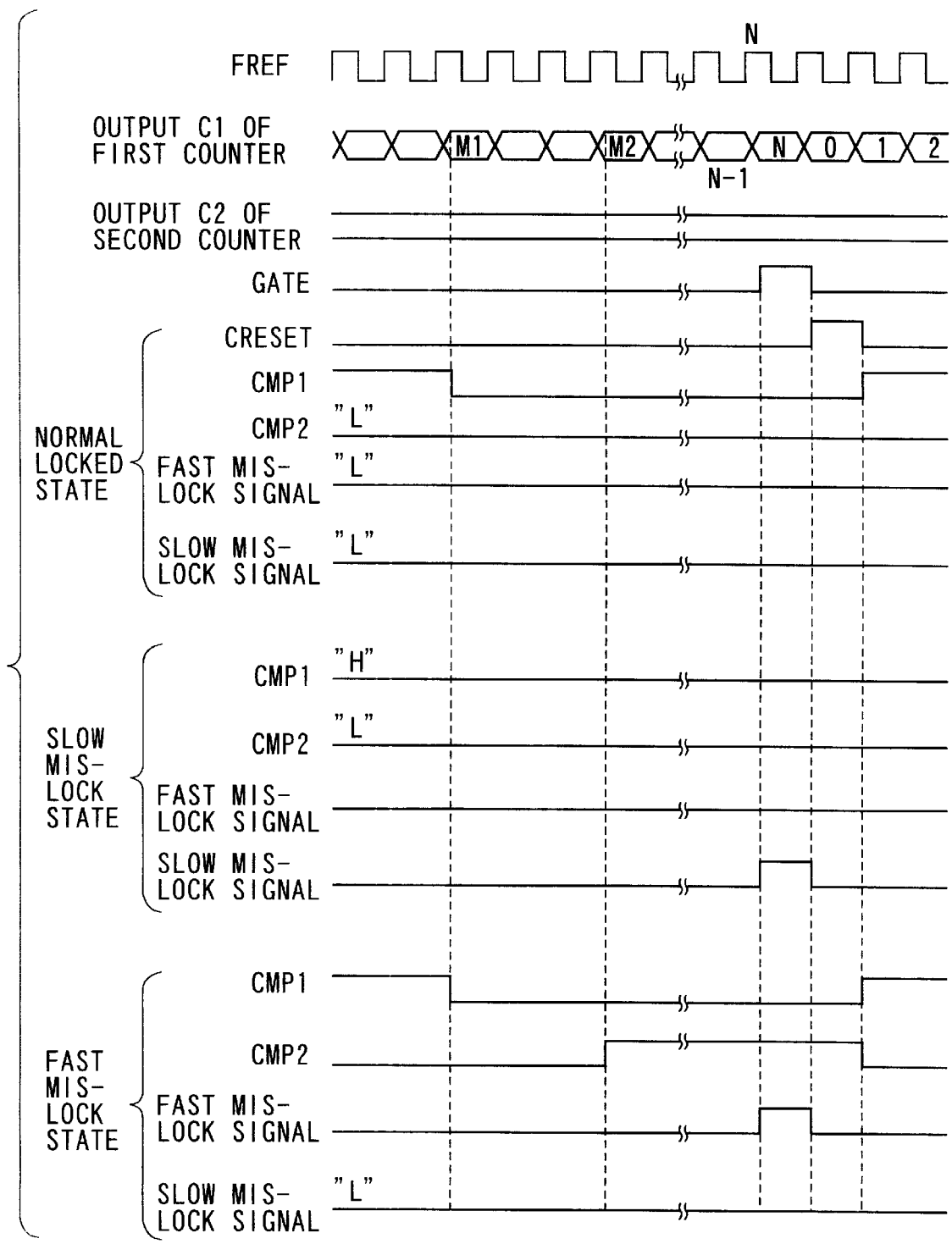
FIG. 11 is a waveform diagram explaining the operation of the mis-lock detecting circuit shown in FIG. 10.

The operation of the mis-lock detecting circuit 14 shown in FIG. 10 will be explained with reference to the waveform diagram of FIG. 11.

Assume that the DLL 10 is normally locked. When the count signal C1 output from the first counter 32 reaches the value N, the latch circuit 47 latches the output signal of the first comparator 34 at the leading edge of the reference signal FREF. The output signal GATE of the latch circuit 47 therefore rises to high level. As a result, the output signal of the NOR circuit 46 rises to high level, and the signal D0 output from the multiplied signal generator 31 is no longer supplied to the second counter 33. The count signal C2 output from the second counter 33, which has been counting the pulses of the signal D0 output from the multiplied signal generator 31, also reaches the value N. The output signals of the second counters 33 and third comparator 36 therefore fall to low level. At the same time the latch circuit 47 latches the output signal of the first comparator 34, the latch circuits 49 and 50 latch the output signals of the second and third comparators 35 and 36, respectively. The signals CMP1 and CMP2, output from the latch circuits 49 and 50, fall to low level.

Hence, the slow mis-lock signal output from the AND circuit 37 is at low level. So is the fast mis-lock signal output from the AND circuit 38. Thus, neither the flip-flop circuit 39 nor the flip-flop circuit 40 is set.

That is, while the DLL 10 remains normally locked, the up-signal and the PHC reset signal are at low level. The phase comparator 12 (FIG. 4) is not reset. Nor is the error signal VERR forcibly set at high level. The DLL 10 therefore stays in the same state as before.

When the count signal C1 output from the first counter 32 reaches the value N, the count signal C2 output from the second counter 33 may have a value greater than 0.5N and less than 1.5N. If so, the DLL 10 is in pull-in state. In this case, too, the count signal C2 output from the second counter 33 has a value greater than 0.5N and less than 1.5N. Both the up-signal and the PHC reset signal are therefore set at low level as in the case mentioned above.

The DLL 10 may be erroneously locked such that the controlled delay circuits of the voltage-controlled delay section 11 have a longer delay time than while the DLL 10 remains normally locked. If this is the case, the count signal C2 of the second counter 33 has a value of 0.5N or less when the count signal C1 of the first counter 32 reaches the value N. Thus, the signal output from the second comparator 35 rises to high level. The slow mis-lock signal output from the AND circuit 37 therefore rises to high level. When the latch circuit 47 latches the output signal of the first comparator 34, the latch circuits 49 and 50 latch the output signals of the second and third comparators 35 and 36, respectively. The output signal CMP1 of the latch circuit 49 rises to high level, whereas the output signal CMP2 of the latch circuit 50 falls to low level. As a result, the slow mis-lock signal output from the AND circuit 37 rises to high level. Thereafter, the flip-flop circuit 39 is set, setting the up-signal at high level.

When the up-signal is set at high level, the error signal VERR output from the phase comparator 12 (FIG. 4) is forcibly set at high level. The controlled delay circuits of the voltage-controlled delay section 11 are thereby controlled such that their delay time becomes shorter. The DLL 10 therefore assumes a short mis-locked state. The DLL 10 remains in the short mis-locked state until the AND circuit 38 outputs a fast mis-lock signal. When the AND circuit 38 outputs a fast mis-lock signal, the flip-flop circuit 39 is reset, setting the up-signal at low level.

Assume that the controlled delay circuits of the voltage-controlled delay section 11 have a short delay time each, and that the DLL 10 is therefore erroneously locked. In this case, the count signal C2 output from the second counter 33 acquires a value of 1.5N or more when the count signal C1 output from the first counter 32 reaches the value N. The output signal of the third comparator 36 therefore rises to high level. The latch circuits 49 and 50 latch the output signal of the second comparator 35 and the output signal of the third comparator 36, respectively, at the same time the latch circuit 47 latches the output signal of the first comparator 34. As a result, the output signal CMP1 falls to low level, whereas the output signal CMP2 of the latch circuit 50 rises to high level. The fast mis-lock signal output from the AND circuit 38 is thereby set at high level. Thereafter, the flip-flop circuit 40 is reset, whereby the PHC reset signal rises to high level.

When the PHC reset signal rises to high level, the phase comparator 12 (FIG. 4) is reset. Thereafter, at the leading edge of the delayed signal SX, which is much delayed with respect to the delayed signal S1, the flip-flop circuit 40 is reset. As a result, the PHC reset signal falls to low level.

Thus, in the second embodiment of the invention, the reference signal FREF can have any duty as in the first embodiment. The DLL 10 according to the second embodiment can therefore be put to various uses. Since the mis-lock detecting circuit 14 reliably detects a mis-locked state of the DLL 10, the DLL 10 can be released from the mis-locked state to operate normally, just like the DLL according to the first embodiment. In addition, the second embodiment is advantageous in the following respects.

The latch circuit 47 latches the output signal of the first comparator 24 when the count signal C1 output from the first counter 32 reaches the value N. The output signal of the latch circuit 47 stops the second counter 33. At this time, the latch circuits 49 and 50 latch the output signal of the second comparator 35 and the output signal of the third comparator 36, respectively. In view of this, the first and second counters 32 and 33 need not be synchronous counters, i.e., high-speed counters. The counters 32 and 33 may be asynchronous counters as well, which operate at a relatively low speed. If so, the mis-lock detecting circuit 14 can not only operate reliably, but also be simplified in terms of structure.

In both multiplied signal generators 31 shown in FIGS. 5 and 10, the leading-edge detectors 41 to 43 and adder circuit 44 cooperate, generating a pseudo twice-multiplied signal from the reference signal FREF and the ½ divider 45 divides the frequency of the pseudo twice-multiplied signal, generating a signal D0. Instead, an m-multiplied signal may be generated from the reference signal FREF (m is 3 or a greater positive integer) and the frequency of the m-multiplied signal may be divided by m, thereby to generate a signal D0.

Figure 12:
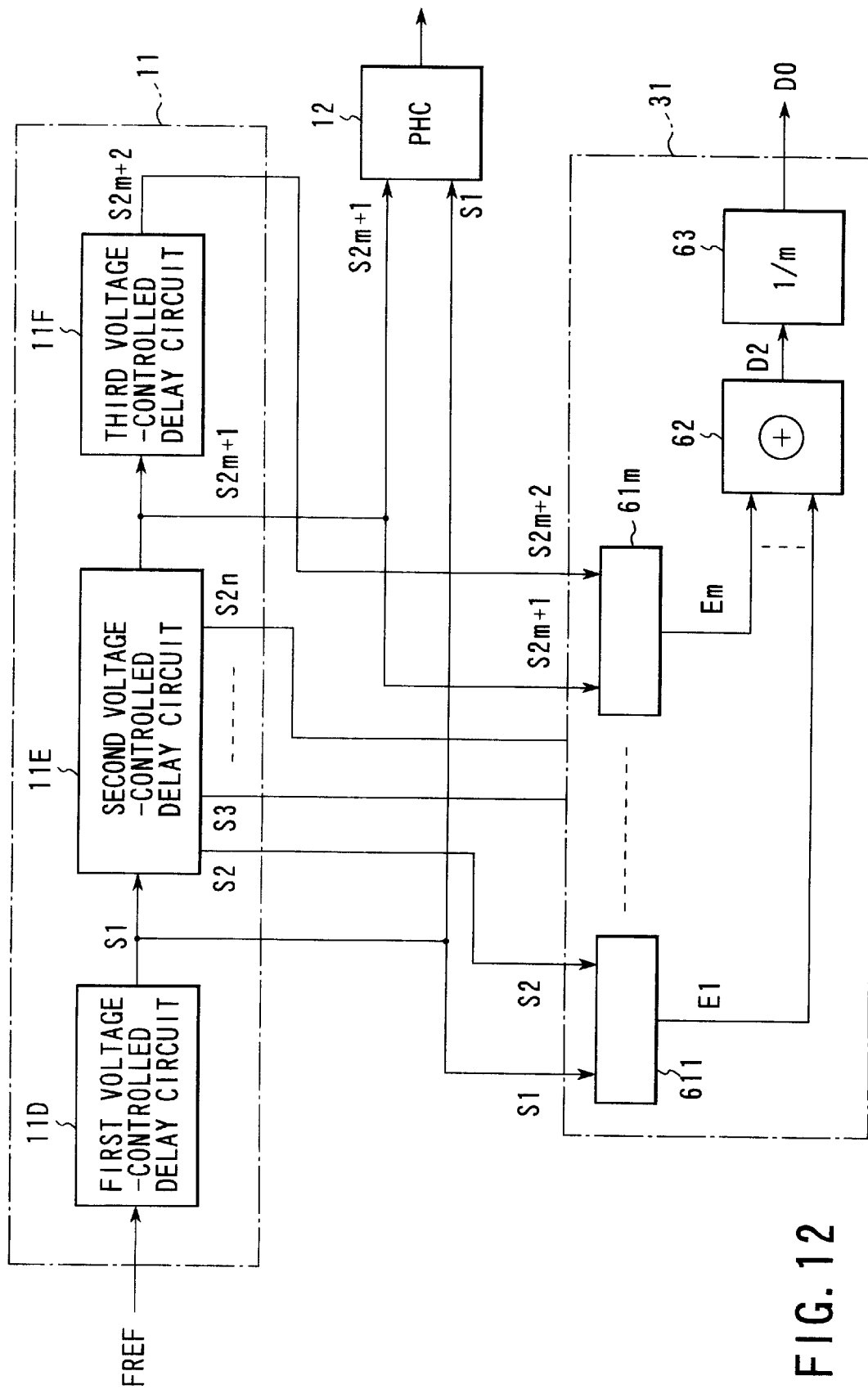
FIG. 12 is a block diagram showing a section of a mis-lock detecting circuit for use in the third embodiment of the invention, along with the voltage-controlled delay section and the phase comparator, both incorporated in the third embodiment.

FIG. 12 is a block diagram showing a section of a mis-lock detecting circuit for use in the third embodiment of the invention. This section of the mis-lock detecting circuit generates an m-multiplied signal from a reference signal FREF and divides the frequency of the m-multiplied signal by m. It is equivalent to the multiplied signal generator 31 shown in FIGS. 5 and 10. FIG. 12 also shows the voltage-controlled delay section 11 and the phase comparator 12, both incorporated in the third embodiment.

The voltage-controlled delay section 11 comprises three voltage-controlled delay circuits 11D, 11E and 11F that are connected in series. The first and third voltage-controlled delay circuits 11D and 11F are composed of one controlled delay circuit each. The second voltage-controlled delay circuit 11E is composed of more controlled delay circuits than the voltage-controlled delay circuit 11B shown in FIG. 4. The delayed signal S1 output from the first voltage-controlled delay circuit 11D, the delayed signals S2, S3, . . . . S2m, S2m+1 from the second voltage-controlled delay circuit 11E, and the delayed signal S2m+2 output from the third voltage-controlled delay circuit 11F are input to an m-multiplied signal generator 31. The delayed signal S1 output by the first voltage-controlled circuit 11D and the delayed signal 2m+1 output by the last controlled delay circuit of the second voltage-controlled delay circuit 11E are input to the phase comparator 12.

The m-multiplied signal generator 31 comprises an m number of leading-edge detectors 611 to 61m, an adder circuit 62, and a 1/m frequency divider 63. The leading-edge detectors 611 to 61m receive two adjacent delayed signals each. That is, they receive S1 and S2, S3 and S4, S5 and S6, . . . S2m+1 and S2m+2, respectively. They output pulse signals E1 to Em, each having a pulse width equivalent to the delay time, i.e., a period between the leading edges of the two adjacent delayed signals. The adder circuit 62 adds the pulse signals E1 to Em output from the leading-edge detectors 611 to 61m, generating an m-multiplied signal D2. The 1/m frequency divider 63 divides the frequency of the m-multiplied signal D2 by m, generating a signal D0.

In the third embodiment, the delayed signal S2m+2 may be output from a different position, thereby to adjust the above-mentioned value N which is used to determine whether the DLL is erroneously locked or not.

Figure 13:
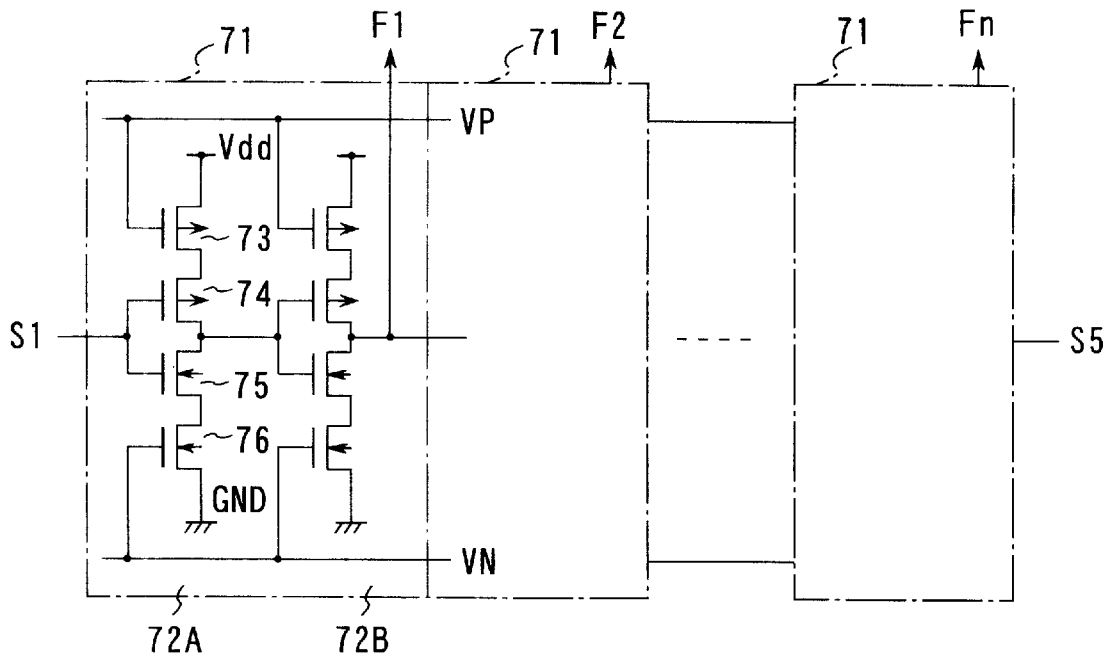
FIG. 13 is a circuit diagram depicting one of the voltage-controlled delay circuits incorporated in the voltage-controlled delay section used in each of the embodiments.

FIG. 13 shows the second voltage-controlled delay circuit 11E in detail.

As shown in FIG. 13, the second voltage-controlled delay circuit 11E comprises a plurality of controlled delay circuits 71 connected in series. Each of the controlled delay circuits 71 comprises two CMOS inverters 72A and 72B. Each CMOS inverter comprises two P-channel MOS transistors 73 and 74 and two N-channel MOS transistors 75 and 76. The source-drain paths of the P-channel MOS transistors 73 and 74 are connected in series between the output node and the power-supply voltage node Vdd. The source-drain paths of the N-channel MOS transistors 75 and 76 are connected in series between the output node and the ground voltage node GND.

Of the P-channel MOS transistors 73 and 74 receives, one receives at its gate the control voltage VP that corresponds to the control signal LPFO output from the low-pass filter 13 of the DLL, i.e., the third embodiment. The other of the P-channel MOS transistors 73 and 74 receives, at its gate, the output signal of the preceding controlled delay circuit or the output signal of the other CMOS inverter incorporated in the same controlled delay circuit. Of the N-channel MOS transistors 75 and 76 receives, one receives at its gate the control voltage VN that corresponds to the control signal LPFO output from the low-pass filter 13. The other of the N-channel MOS transistors 75 and 76 receives, at its gate, the output signal of the preceding controlled delay circuit or the output signal of the other CMOS inverter incorporated in the same controlled delay circuit.

In each of the controlled delay circuits 71 shown in FIG. 13, the on-resistance of the P- or N-channel MOS transistor that receives the control voltage VP or VN at its gate changes in accordance with the control voltage VP or VN. The time, by which the input signal of each CMOS inverter (72A or 72B) is delayed, thereby controlled.

The controlled delay circuits of the first and third voltage-controlled delay circuit 11D and 11F have the same structure as the controlled delay circuits 71 of the second voltage-controlled delay circuit 11E.

Figure 14:
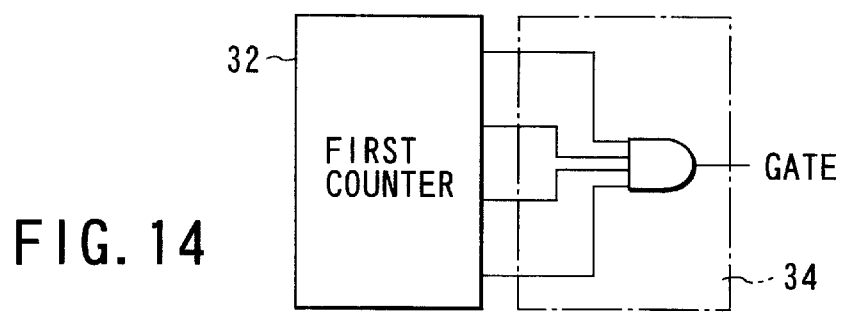
FIG. 14 is a circuit diagram depicting the first comparator incorporated in the each of the embodiments.

FIG. 14 shows the first comparator 34 incorporated in the each of the embodiments described above. The output signal of the first counter 32 is a 4-bit parallel signal, and the first comparator 34 detects the value N that is a decimal number of 16. In this case, the first comparator 34 is an AND circuit for detecting that the four bits of the signal output from the first counter 32 are all at high level.

The second comparator 35 and the third comparator 36 can be easily constituted as the first comparator 34, by using logic circuits.

Figures 15A, 15B:
FIG. 15A is circuit diagram showing a type of a leading-edge detector for use in each of the embodiments.
FIG. 15B is circuit diagram showing another type of a trailing-edge detector for use in each of the embodiments.

FIG. 15A is circuit diagram showing one type of a leading-edge detector for use in each of the embodiments described above. This leading-edge detector can be used as leading-edge detectors 41 or 611 that serve to generate a signal E1 from the delayed signals S1 and S2. As shown in FIG. 15A, the leading-edge detector comprises two NOR circuits 81 and 82. The NOR circuits 81 and 82 have two input terminals each. One input terminal of the first NOR circuit 81 is connected to the output terminal of the second NOR circuit 82, and one input terminal of the second NOR circuit 82 is connected to the output terminal of the first NOR circuit 81. Thus, the NOR circuits 81 and 82 constitute a flip-flop circuit. The other input terminal of the first NOR circuit 81 receives the delayed signal S1, and the other input terminal of the second NOR circuit 82 receives the delayed signal S2. The signal E1 is output from the output terminal of the second NOR circuit 82.

The leading-edge detectors other than the detectors 41 and 611 have the same structure as is shown in FIG. 15A, though they receive different delayed signals.

In the embodiments described above, the multiplied signal generator 31 comprises leading-edge detectors that generate pulse signals E1 to Em, each having a pulse width equivalent to the period between the leading edges of the two delayed signals input to the leading-edge detector. The adder circuit adds the pulse signals E1 to Em, and the frequency divider divides the frequency of the output signal of the adder circuit, thereby generating a signal D0. The leading-edge detectors of the type depicted in FIG. 15A may be replaced by trailing-edge detectors of the type illustrated in FIG. 15B.

The trailing-edge detector of in FIG. 15B is designed to generate a signal E1 from the delayed signals S1 and S2. It comprises two NAND circuits 83 and 84. The NAND circuits 83 and 84 have two input terminals each. One input terminal of the first NAND circuit 83 is connected to the output terminal of the second NAND circuit 84, and one input terminal of the second NAND circuit 84 is connected to the output terminal of the first NAND circuit 83. Thus, the NAND circuits 83 and 84 constitute a flip-flop circuit. The other input terminal of the first NAND circuit 83 receives the delayed signal S1, and the other input terminal of the second NAND circuit 84 receives the delayed signal S2. The signal E1 is output from the output terminal of the second NAND circuit 84.

The leading-edge detectors and the trailing-edge detectors, described above, are not limited to flip-flop circuits. They may be any other types of circuits that can detect the leading or trailing edges of the input signals.

As has been described, the present invention can provide a delay locked loop which can use signals of whatever duty as the reference signal and can therefore be put to various uses, the mis-locked state of which can be detected reliably, and which can be released from the mis-locked state to operate normally.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A delay locked loop comprising:
    a voltage-controlled delay section configured to receive a reference signal and a delay control signal, including,
        a plurality of voltage controlled delay circuits connected in series, each voltage controlled delay circuit having a delay time, and configured to delay sequentially the reference signal in accordance with the delay control signal, thereby to output a first delayed signal through an $(n-1)^{th}$ delayed signal to an $n^{th}$ delayed signal that are sequentially delayed in time;
    a phase comparator configured to receive the first delayed signal and the $n-1^{th}$ delayed signal, detect a phase difference between the first and $n-1^{th}$ delayed signals and output an error signal representing the phase difference detected;
    a filter circuit configured to receive the error signal from the phase comparator, extract a direct-current component from the error signal, and supply the direct-current component, as the delay control signal, to the voltage controlled delay circuit; and
    a mis-lock detecting circuit configured to generate a plurality of pulse signals, each pulse signal having a width corresponding to a difference in a delay time between adjacent delay signals of the first to $n^{th}$ delayed signals, to add the pulse signals to generate a sum signal, and to compare the sum signal with the reference signal in terms of a number of pulses contained in the sum signal and reference signal per unit time, thereby detecting a mislocked state of the voltage-controlled delay section.

2. A delay locked loop according to claim 1, wherein the delay time of each of the first to $n^{th}$ delayed signals output from the voltage-controlled delay section is controlled by the delay control signal so that a delay time between the first and $n-1^{th}$ delayed signals is substantially equal to a one-cycle time of the reference signal while the voltage-controlled delay section remains normally locked.

3. A delay locked loop according to claim 1, wherein the mis-lock detecting circuit comprises:
    a mis-lock detect signal generating circuit configured to detect a mis-locked state of the voltage-controlled delay section and output at least one mis-lock detect signal upon detection of the mis-locked state of the voltage-controlled delay section; and
    a mis-lock control signal generating circuit configured to generate, from said at least one mis-lock detect signal, a mis-lock control signal configured to set an output voltage of the phase comparator.

4. A delay locked loop according to claim 3, wherein said at least one mis-lock detect signal output from the mis-lock detect signal generating circuit is composed of a first mis-lock detect signal and a second mis-lock detect signal, said first mis-lock detect signal is output from the mis-lock detect signal generating circuit when the voltage-controlled delay section remains locked while the delay time between the first and $n-1^{th}$ delayed signals is shorter than a delay time which exists between the first and $n-1^{th}$ delay signals while the voltage-controlled delay section remains normally locked and said second mis-lock detect signal is output from the mis-lock detect signal generating circuit when the voltage-controlled delay section remains locked while the delay time between the first and $n-1^{th}$ delayed signals is longer than a delay time which exists between the first and $n-1^{th}$ delay signals while the voltage-controlled delay section remains normally locked.

5. A delay locked loop according to claim 4, wherein the mis-lock detect signal generating circuit comprises:
    a frequency-dividing circuit configured to receive the signal output from the adder circuit and dividing a frequency of the signal by a predetermined ratio, thereby to output a signal;
    a plurality of pulse signal generating circuits configured to receive an adjacent two of the first to $n^{th}$ delayed signals and generate a plurality of pulse signals, each pulse signal having a width corresponding to a difference in delay time between adjacent two of the first to nth delayed signals;
    an adder circuit configured to add the pulse signals generated by the pulse signal generating circuits;
    a first counter circuit configured to receive the reference signal and count pulses of the reference signal, thereby to output a first count signal;
    a first comparing circuit configured to receive the first count signal output from the first counter circuit and compare the first count signal with a first fixed value, to output a first signal when the first count signal has a value equal to the first fixed value;
    a second counter circuit configured to receive the signal output from the frequency-dividing circuit and count pulses of the signal, thereby to output a second count signal;
    a second comparing circuit configured to receive the second count signal output from the second counter circuit, to compare the second count signal with a second fixed value smaller than the first fixed value, and to output a second signal when the second count signal has a value equal to the second fixed value;
    a third comparing circuit configured to receive the second count signal output from the second counter circuit, to compare the second count signal with a third fixed value larger than the first fixed value, and to output a third signal when the second count signal has a value equal to the third fixed value;
    a first logic circuit configured to receive the first and second signals output from the first and second comparing circuits and generate the first mis-lock detect signal from the first and second signals output from the first and second comparing circuits; and
    a second logic circuit configured to receive the first and third signals output from the first and third comparing circuits and generate the second mis-lock detect signal from the first and third signals output from the first and third comparing circuits.

6. A delay locked loop according to claim 5, wherein each of the pulse signal generating circuits comprises:
    two NOR circuits each including,
        a first input terminal, and
        a second input terminal,
    wherein said NOR circuits are configured as a flip-flop circuit in which two adjacent signals are supplied respectively to the first input terminals of the NOR circuits and a signal output from each NOR circuit is supplied to the second input terminal of the other NOR circuit.

7. A delay locked loop according to claim 5, wherein the first and second logic circuits are AND circuits.

8. A delay locked loop according to claim 5, wherein the first fixed value is N, where N is 1 or a greater positive integer, the second fixed value is 0.5N, and the third fixed value is 1.5N.

9. A delay locked loop according to claim 5, wherein the mis-lock control signal generating circuit comprises:

a first flip-flop circuit having a set terminal and a reset terminal, configured to receive the signals output from the first and second logic circuits at the set terminal and reset terminal, respectively, and output a first mis-lock control signal which sets an output voltage of the phase comparator at a high potential; and a second flip-flop circuit having a set terminal and a reset terminal, configured to receive at the set terminal the signal output from the second logic circuit, and to receive at the reset terminal any one of the first to n−1$^{th}$ delayed signals, and to output a second mis-lock control signal which sets the output voltage of the phase comparator at a low potential.

10. A delay locked loop according to claim 4, wherein the mis-lock detect signal generating circuit comprises:

a plurality of pulse signal generating circuits configured to receive an adjacent two of the first to n$^{th}$ delayed signals and generate a plurality of pulse signals, each pulse signal having a width corresponding to a difference in delay time between adjacent two of the first to n$^{th}$ delayed signals;

an adder circuit configured to add the pulse signals generated by the pulse signal generating circuits;

a frequency-dividing circuit configured to receive the signal output from the adder circuit and divide a frequency of the signal by a predetermined ratio, thereby to output a signal;

a first counter circuit configured to receive the reference signal and count pulses of the reference signal, thereby to output a first count signal;

a first comparing circuit configured to receive the first count signal output from the first counter circuit, and to compare the first count signal with a first fixed value, and to output a first signal when the first count signal has a value equal to the first fixed value;

a first logic circuit configured to receive the signal output from the frequency-dividing circuit and output the output signal of the frequency-dividing circuit until the first comparing circuit outputs the first signal upon detection that the first count signal has a value equal to the first fixed value;

a second counter circuit configured to receive the signal output from the first logic circuit, to count pulses of the signal, and to output a second count signal;

a second comparing circuit configured to receive the second count signal output from the second counter circuit, to compare the second count signal with a second fixed value smaller than the first fixed value, and to output a second signal when the second count signal has a value equal to the second fixed value;

a third comparing circuit configured to receive the second count signal output from the second counter circuit, to compare the second count signal with a third fixed value larger than the first fixed value, and to output a third signal when the second count signal has a value equal to the third fixed value;

a first latch circuit configured to receive and latch the first signal output from the first comparing circuit;

a second latch circuit configured to receive and latch the second signal output from the second comparing circuit;

a third latch circuit configured to receive and latch the third signal output from the third comparing circuit;

a fourth latch circuit configured to receive and latch a signal output from the first latch circuit;

a second logic circuit configured to receive signals output from the first and second latch circuits and generate the first mis-lock detect signal from the signals output from the first and second latch circuits; and a third logic circuit configured to receive signals output from the first and third latch circuits and generate the second mis-lock detect signal from the signals output from the first and third latch circuits.

11. A delay locked loop according to claim 10, wherein each of the pulse signal generating circuits comprises:

two NOR circuits each including,
a first input terminal, and
a second input terminal,
wherein said NOR circuits are configured as a flip-flop circuit in which two adjacent delayed signals are supplied respectively to the first input terminals of the NOR circuits and a signal output from each NOR circuit is supplied to the second input terminal of the other NOR circuit.

12. A delay locked loop according to claim 10, wherein the first logic circuit is a NOR circuit.

13. A delay locked loop according to claim 10, wherein the second and third logic circuits are AND circuits.

14. A delay locked loop according to claim 10, wherein the first fixed value is N, where N is 1 or a greater positive integer, the second fixed value is 0.5N, and the third fixed value is 1.5N.

15. A delay locked loop according to claim 1, wherein each of the controlled delay circuits has:

a first voltage-applying node for applying a power-supply voltage;

a second voltage-applying node for applying a ground voltage;

a first CMOS inverting circuit comprising a first output node, first and second MOS transistors of first channel type, each having a source-drain path and a gate, and third and fourth MOS transistors of second channel type, each having a source-drain path and a gate, wherein the source-drain paths of the first and second MOS transistors are connected in series between the first voltage-applying node and the first output node, the gates of the first and second MOS transistors are supplied with a first control signal generated from the delay control signal and a signal output from the preceding controlled delay circuit respectively, the source-drain paths of the third and fourth MOS transistors are connected in series between the first output node and the second voltage-applying node, and the gates of the third and fourth MOS transistors are supplied with a second control signal generated from the delay control signal and the signal output from the preceding controlled delay circuit respectively; and a second CMOS inverting circuit comprising a second output node, fifth and sixth MOS transistors of first channel type, each having a source-drain path and a gate, and seventh and eighth MOS transistors of second channel type, each having a source-drain path and a gate, wherein the source-drain paths of the fifth and sixth MOS transistors are connected in series between the first voltage-applying node and the second output node, the gates of the fifth and sixth MOS transistors are supplied with the first control signal and a signal obtained at the first output node respectively, the source-drain paths of the seventh and eighth MOS transistors are connected in series between the second output node and the second voltage-applying node, the gates of the seventh and eighth MOS transistors are supplied with the second control signal and the signal obtained at the first output node, and a signal obtained at the second output node is supplied to the following controlled delay circuit.

* * * * *